US008786784B2

(12) United States Patent
Magnusen

(10) Patent No.: US 8,786,784 B2
(45) Date of Patent: Jul. 22, 2014

(54) PSEUDO DIGITAL GAIN CONTROL FOR BROADBAND TUNER

(75) Inventor: Timothy M. Magnusen, Uxbridge (CA)

(73) Assignee: CSR Technology, Inc., San Jose, CA (US)

( * ) Notice: Subject to any disclaimer, the term of this patent is extended or adjusted under 35 U.S.C. 154(b) by 0 days.

(21) Appl. No.: 13/460,508

(22) Filed: Apr. 30, 2012

(65) Prior Publication Data

US 2012/0212278 A1 Aug. 23, 2012

Related U.S. Application Data

(62) Division of application No. 11/557,307, filed on Nov. 7, 2006, now Pat. No. 8,184,206.

(51) Int. Cl.
*H04N 5/52* (2006.01)
(52) U.S. Cl.
USPC ............................ 348/678; 348/725; 348/720
(58) Field of Classification Search
USPC .................. 348/725–726, 731, 678, 607, 720;
455/315, 339, 302, 232.1, 234.1,
455/234.2, 253.2; 327/261–263, 157, 536,
327/268, 283, 290, 379; 330/279, 284
IPC ....................................................... H04N 5/52
See application file for complete search history.

(56) References Cited

U.S. PATENT DOCUMENTS

| | | |
|---|---|---|
| 5,646,620 A | 7/1997 | Regier |
| 5,796,852 A | 8/1998 | Yamaguchi |
| 6,177,964 B1 | 1/2001 | Birleson et al. |
| 6,249,158 B1 | 6/2001 | Schillhof et al. |
| 6,625,433 B1 | 9/2003 | Poirier et al. |
| 7,397,292 B1 | 7/2008 | Potanin |
| 2006/0082391 A1 | 4/2006 | Hsu et al. |
| 2006/0244549 A1 | 11/2006 | Takahata |

FOREIGN PATENT DOCUMENTS

| | | |
|---|---|---|
| EP | 1191686 | 3/2002 |
| GB | 2415844 | 1/2006 |
| WO | WO-00/18007 | 3/2000 |
| WO | WO-2004/030247 | 4/2004 |
| WO | WO-2004/093312 | 10/2004 |

OTHER PUBLICATIONS

International Search Report and Written Opinion issued for PCT/US2007/083105, Date of mailing: Oct. 10, 2008, 22 pages.

*Primary Examiner* — Trang U Tran
(74) *Attorney, Agent, or Firm* — Fulbright & Jaworski LLP

(57) ABSTRACT

A digital level control circuit, such as an Automatic Gain Control, includes a plurality of digitally selectable signal levels with transitions between levels gradually varied to avoid signal output level discontinuities. An up/down counter may be used to incrementally stepwise transition an output signal between the digitally selectable output levels. Stepwise application of a control signal to the appropriate switching elements (e.g., FETs) forming an attenuator circuit may be implemented to moderate a switching time of the switching elements to provide a more gradual transition between element operating states. A deglitch circuit may be employed to latch the switching elements to achieve the desired state at the end of a desired switching transition period.

12 Claims, 2 Drawing Sheets

PSEUDO DIGITAL GAIN CONTROL FOR BROADBAND TUNER

CROSS-REFERENCE TO RELATED APPLICATIONS

This application is a divisional application of U.S. patent application Ser. No. 11/557,307, filed Nov. 7, 2006 and entitled, "PSEUDO DIGITAL GAIN CONTROL FOR BROADBAND TUNER," the disclosure of which is incorporated herein by reference. This application is also related to and incorporates by reference herein in their entireties the disclosures of U.S. patent application Ser. No. 11/376,745, filed Mar. 15, 2006 and entitled, "BROADBAND INTEGRATED TUNER," issued Sep. 25, 2007 as U.S. Pat. No. 7,274,410; U.S. patent application Ser. No. 08/426,080, filed Apr. 21, 1995 and entitled, "HIGHLY INTEGRATED TELEVISION TUNER ON A SINGLE MICROCIRCUIT," issued Apr. 7, 1998 as U.S. Pat. No. 5,737,035; U.S. patent application Ser. No. 08/904,908 filed Aug. 1, 1997 and entitled, "BROADBAND INTEGRATED TELEVISION TUNER," issued Jan. 23, 2001 as U.S. Pat. No. 6,177,964; and U.S. patent application Ser. No. 09/572,393, filed May 16, 2000 and entitled, "BROADBAND INTEGRATED TUNER," issued Jul. 18, 2006 as U.S. Pat. No. 7,079,195.

TECHNICAL FIELD

The invention generally relates to gain control circuits and more particularly to automatic gain control mechanisms and methods for use with or forming a part of circuits such as tuner circuits.

BACKGROUND OF THE INVENTION

Automatic gain control (AGC) is an electronic system found in many types of devices including, for example, amplifier circuits. AGC circuitry is used is to control the gain of a system in order to maintain adequate performance over a range of input signal levels.

There are two general types of gain control in terms of how the gain varies in response to an applied control signal; analog and digital. Analog AGC circuits use an analog gain control signal to continuously vary the gain of a circuit. Digital AGC circuits use instead a digital control signal lines to define a plurality of gain values steps to discretely set the gain of a circuit being controlled. Analog AGC circuits may be relatively simple to implement but then have significant disadvantages including lesser accuracy, precision and noise than equivalent digital circuitry. While digital AGC circuits may be superior in the aforementioned areas, they tend to be more complex and, depending on resolution, may generate parasitic signal outputs caused by discontinuities resulting from digital output switching operations.

Practical implementations of analog AGC circuits may be quite complex so as to compensate for various drawbacks and disadvantages. One problem results from the difficulty of accurately and precisely generating an analog control signal or regulating the operation of a circuit using an analog control signal such that the resulting gain will be exactly a specific value. Lack of precision may be due to process variations during circuit production, circuit mismatches, and other variations that may be difficult to control. For example, if a 2.5 volt gain control signal is applied to a circuit, it may be difficult to guarantee that the resulting circuit gain will be exactly 10 dB; it might easily be 10 dB plus or minus a half a dB. Another problem inherent in analog control is the nature of the control signal. That is, some parameter of the control signal, such as voltage, is used to control circuit gain. Thus, any noise (i.e., changes to the voltage caused by spurious signals, thermal effects, and/or other phenomenon) introduced into the signal affecting the control parameter will result in noise being introduced into the controlled signal. In effect, the AGC can act as an amplitude modulator, introducing noise into the output or the circuitry (e.g., amplifier) being controlled.

Digital circuitry generally provides enhanced control capabilities. For example, a digital code of 10 might be programmed or otherwise interpreted to result in a circuit gain of exactly 10 dB, while setting the digital code to one less, i.e., 9, might result in a gain of exactly 9 dB. However, unlike analog signals, digital signals do not rely on a continuously variable signal parameter to transmit control information but on binary signal conditions typically corresponding to high and low signal levels. Thus, digital AGC circuits employ a number of switches to effect gain changes in a number of discrete steps. Instead of a continuous change in gain possible using an analog circuit, digital AGC uses a number of finite, discrete and therefore discontinuous steps. However, as explained below, because gain is varied discontinuously with essentially instantaneous, stepwise changes, a number of problems are created that may cause the controlled and/or associated circuitry to malfunction or exhibit degraded performance.

In contrast to analog circuits, implementations of digital AGC often include only high or low level control voltages such that control signals generated by a digital AGC circuit are relatively immune from or resistant to externally produced noise and noise creating phenomenon. The digital signals themselves are inherently immune from or tolerant of noise, each representing either of two binary signal states rather than a continuum of signal levels, i.e., discrete steps with no valid levels in between. These characteristics result in little or no opportunity for parasitic amplitude modulation of the output signal of the associated circuitry being controlled.

One issue to be addressed in the design of a digital control circuit (such as a digital AGC) is the resolution to be supported, i.e., the number of bits used to control the output and the step size or sizes between increments. The smaller the step size used, the larger the attenuator area needed, since more bits imply more circuitry responsive to those bits. To minimize cost it becomes desirable to use only that resolution required for the specified application by using large digital steps. However, large steps result in large instantaneous or nearly instantaneous changes in gain. The resultant "step function" in the amplitude of the controlled signal may cause abnormal or faulty operation of other circuits. For example, when an AGC circuit is used as part of a television tuner, operation of a demodulator circuit may be adversely affected (e.g., the demodulator may "lose lock") by signal discontinuities caused by a step function. This step function is a result of digital switching implemented by a number of switching circuits comprising the digital control circuit, each switch causing a discrete change in gain. Typically each signal line represents some weighted value with respect to the other lines. For example, each signal line may control gain in a discrete amount that is some power of two. Activation of any signal line results in an almost instantaneous level change in the form of a step function that causes spurious signals to be generated, possible "over-shoot"/"under-shoot" of the circuit being controlled, and similar and/or related problems.

BRIEF SUMMARY OF THE INVENTION

The present invention is directed to systems and methods that moderate signal level changes while switching between digitally defined signal levels, e.g., transform a unit step function into a more gradual, continuous function change in signal level. Embodiments of the present invention may include methods and means for gradually varying a signal level during signal level transitions that are responsive to a change in a digital control signal. Signal level during the transition period may be under the control of a timer or similar circuitry that implements a gradual change in voltage levels between digitally defined initial and ending signal levels. Implementations may include the use of a gain control switch in the form of variable resistance (e.g., a MOSFET) controlled to gradually apply or remove a control voltage level to achieve a desired transition profile. The control voltage may be supplied to one or more switching elements that control a level of an input signal, each switch, for example, selectively attenuating the signal by a predetermined amount. Thus, without requiring an increase in resolution, embodiments of the present invention avoid problems associated with rapid level transitions between digitally defined signal levels by moderating or graduating the level change over an appropriate period of time using an appropriate function. The transition function may be defined to optimize circuit operation and may include linear, exponential, logarithmic, power and other functions appropriate to the circuitry and/or range of transitions supported by a device and the set of digital steps and step increments implemented. Level transitions may be implemented under analog or digital control. Thus, the function may be in the form of a plurality of small, intermediate level steps progressing from an initial level to a desired ending level, an analog ramp, or other profile, preferably monotonically increasing or decreasing over an appropriate time period between the initial starting and desired ending levels. A deglitch circuit may be used to latch the resulting control signal and/or the state of a controlled device (e.g., a switching transistor) to maintain the desired state once achieved.

According to some embodiments according to the invention, changes between digitally defined level steps are automatically moderated to provide for a more gradual level transition between steps. The gradual change in level may be accomplished by having a number of intermediate steps implemented by, for an example, a counter circuit, or by other means such as an analog ramp generator circuit used to cause digital switching elements to gradually turn on or off over some desired switching period instead of allowing immediate or very rapid transitions between states (e.g., fully on to fully off or vice versa.) If not moderated, allowing large steps in signal levels can result in signal distortion and improper operation of subsequent circuitry and devices receiving the signal. For example, if part of an automatic gain control circuit (AGC) such as in a television tuner or receiver, a subsequent demodulator circuit may not operate properly when subjected to large near-instantaneous level changes of a signal to be processed.

According to another embodiment of the invention, digital gain control may be implemented by an attenuator in the form of a resistor that is switched in/out of a circuit path using, for example, a MOSFET. However, rather than allowing the MOSFET to be controlled directly by a digital signal used to set the desired attenuation (and thereby circuit gain), a counter circuit provides an increasing or decreasing digital value to a digital to analog converter (DAC) that drives that control voltage used to turn the MOSFET on and off so that the gate voltage, instead of instantaneously changing, changes more slowly over a certain period of time defined by the counter. Thus, while a digital control signal is used to set overall circuit gain using relatively large steps appropriate to the desired resolution, additional circuitry according to various embodiments of the invention implement intermediate steps or a continuous level transition over some preprogrammed transition period of time.

According to another embodiment of the invention, a television tuner may include one or more RF amplifiers, local oscillators, mixer circuits, filters and signal detectors constituting various RF and IF stages for receiving, amplifying, selecting and/or demodulating a television signal. Incorporated within or as part of the RF and/or IF stages may be one or more AGC circuits for maintaining various signal levels at or between various signal strength values. The AGC circuits may include some number of digitally selectable gain or attenuation levels so as to achieve a desired signal level. Transitions between these predefined, selectable signal levels are implemented as a series or sequence of smaller steps or monotonically changing incremental level transitions.

One of the advantages of various embodiments of the invention is an overall reduction in circuitry required in comparison, for example, to requiring a large number of digitally settable levels to avoid large level transitions. Avoiding near instantaneous level changes simplifies overall circuit design, supports higher bandwidths, and avoids other design issues. For example, when integrated into a television tuner, circuit design is simplified by avoiding instantaneous signal level changes that might cause a demodulator to malfunction or cause performance problems in the system. According to one embodiment of the invention, a time period over which a level transition occurs may be programmable so that a resultant circuit gain change is essentially linear from one large step to another large step over a predetermined amount of time and/or at some constant rate. Other methods of moderating signal change level may also be implemented such as a specified dv/dt or di/dt maximum.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 1:
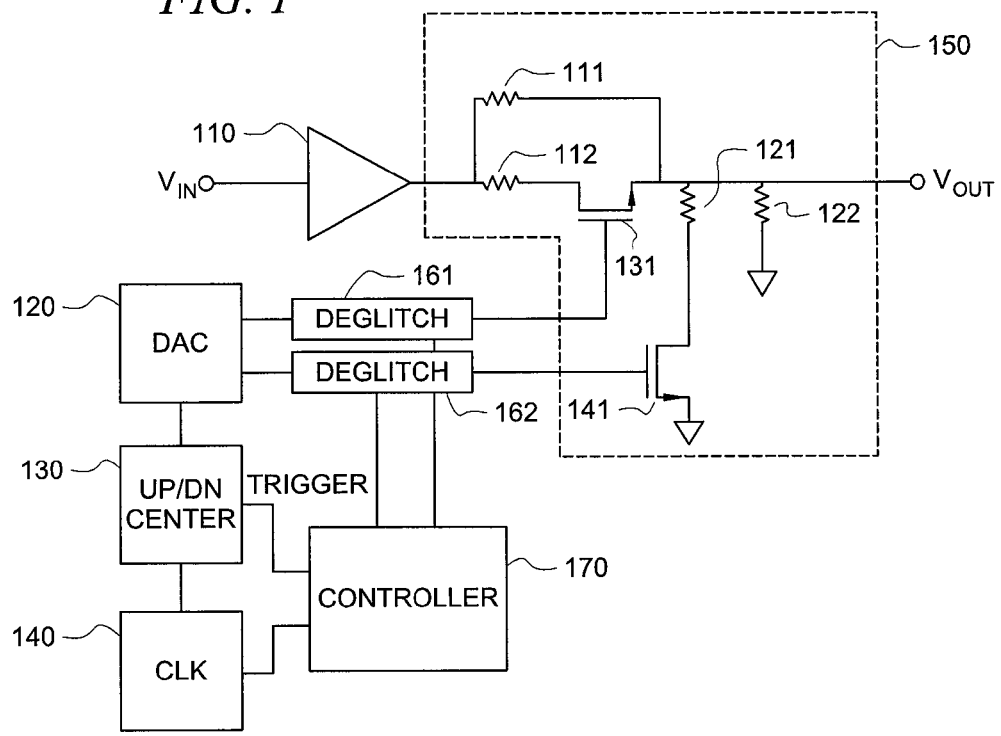
FIG. 1 is a circuit diagram of an automatic gain control circuit (AGC) implemented as switched output attenuator elements controlled by an incremental step moderating circuit.

FIG. 1 is a circuit diagram of an automatic gain control circuit (AGC) implemented as switched output Attenuator 150 having switching elements in the form of FETs 131 and 141 controlled by an incremental step moderating circuit according to an embodiment of the present invention. The moderating circuit includes DAC 120, Up/Down Counter 130, Clock 140, Deglitch Circuits 161, 162 and Controller 170 that act in concert to cause the switching elements to gradually turn on or off over some transition period of gradual or stepwise increasing or decreasing conductance levels. Thus, within the larger intervals between levels selectable or settable by turning FETs 131 and 141 completely on and off, the moderating circuitry implements a sequence of smaller, "sub-interval" stepped or incremental transitions that more gradually change the signal level output while transition between selectable/programmable levels during some transition period.

Controller 170 includes logic in the form of hardware and/or software for controlling a configuration of switching elements (e.g., FETs 131 and 141) to achieve a desired signal level (e.g., $V_{out}$) and initiating/controlling an operation of Up/Down Counter 130 to incrementally and monotonically increase or decrease the signal level by a series or sequence of intermediate steps until fully achieving the desired configuration and/or signal level. Controller 170 further functions to cause Deglitch Circuits 161 and 162 to selectively latch an appropriate control voltage level respectively supplied to FETs 131 and 141 at the end of the sequence of intermediate level changes and upon reaching the desired signal level at the end of a transition period. Configuration control may be accomplished by a decoder circuit, translation or mapping function or other logic incorporated into Controller 170.

Amplifier 110 in the present illustration represents a range of circuitry, whether a conventional amplifier, buffer, or other form or active or passive circuit an output level of which is to be regulated (e.g., provides voltage gain $V_{gain}$). An output of Amplifier 110 supplies an output signal to Attenuator 150 including series and shunt components configured as legs of a voltage divider network. The series components (or upper leg of the voltage divider) include a parallel arrangement of resistor 111 and resistor 112 in series with FET 131. The shunting components (or lower leg of the voltage divider) include resistor 122 in parallel with the series connection of resistor 121 and FET 141. Thus, the output voltage level may be expressed as:

$$V_{out} = V_{in} \times V_{gain} \left( \frac{\frac{R_{112}(R_{141} + R_{121})}{R_{112} + R_{141} + R_{121}}}{\frac{R_{112}(R_{141} + R_{121})}{R_{112} + R_{141} + R_{121}} + \frac{R_{111}(R_{131} + R_{112})}{R_{111} + R_{131} + R_{112}}} \right)$$

By controlling switching elements in the form of FETS 131 and 141, it is possible to obtain four different divisions of the output voltage level such that only relatively large steps are implemented using resistors 111, 112, 121 and 122 and FETs 131 and 141. FETs 131 and 141 have their gates connected to and are driven by digital to analog converter (DAC) 120 through Deglitch Circuits 161 and 162. DAC 120 is coupled to and receives an output from Up/Down Counter 130 which, in turn, receives a trigger from a Controller 170 and Reference Clock 140. Reference Clock 140 sets the time period over which Up/Down Counter 130 and therefore DAC 120 will ramp from one large digital step to the next. Thus, in response to a digital count value supplied by Up/Down Counter 130, DAC 120 will supply a corresponding level signal to the gates of FETS 131 and/or 141 to gradually or stepwise transition between the (in the present example, up to four) available signal output level divisions. Of course, any number of output signal levels may be supported, embodiments of the present invention providing for moderation of level transitions between such larger steps by automatically implementing, according to one embodiment, a series or sequence of small steps or incremental level changes.

Deglitch Circuits 161 and 162 selectively apply the ramped or stepped control output from DAC 120 to either FET 131 or FET 141 so that only one is varied at a time. At the conclusion of the transition period, the respective Deglitch Circuit 161 or 162 latches the signal from DAC 120 or otherwise provides a constant output level to the gate of FET 131 or 141 until a transition in the opposite direction is required under control of Controller 170.

Figure 2:
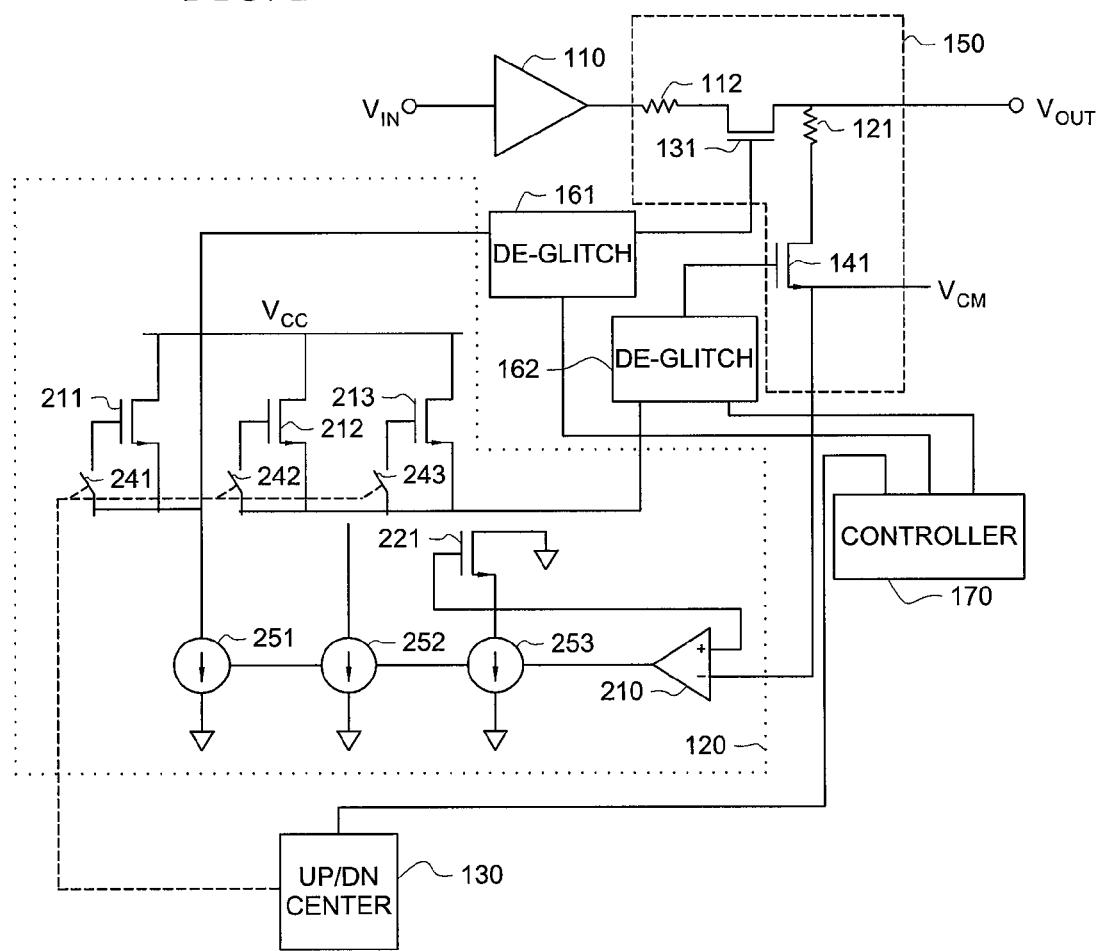
FIG. 2 is a circuit diagram of an AGC including a digital-to-analog converter (DAC) for generating incremental level changes so as to smoothly transition between digitally controlled signal level steps.

FIG. 2 is a circuit diagram of an AGC including a DAC for generating incremental level changes according to an embodiment of the invention so as to incrementally transition between digitally controlled signal level steps including further details of DAC 120. DAC 120 includes a plurality of current sources 251-253 selectively supplying a current to the gates of FETs 131 and 141 of Attenuator 150 through switching elements in the form of FETs 211-213 and Deglitch Circuits 161 and 162. FETs 211-213 have respective gates connected to and are operated in response to a digital output from Up/Down Counter 130. Thus, as a count value supplied by Up/Down Counter 130 is incremented, FETs 211-213 are selectively turned on and off so as to supply a corresponding current from Current Sources 251-253. The resultant voltage level is then supplied to the FETs through respective Deglitch circuits 161 and 162. Deglitch circuits 161 and 162 operate to latch a final output level and supply a signal of the desired final level to the respective FET of Attenuator 150 at a conclusion of the transition period. Again, under control of Controller 170, Deglitch Circuits 161 and 162 selectively route the graduated output level from the respective FETs 211-213 to one of the two FETs 131 and 141 of the Attenuator 150. Thus, while the DAC output voltage level is undergoing change (i.e., is monotonically increasing or decreasing by some number of intermediate level increments), a respective Deglitch Circuit 161 or 162 is passive, basically just passing the signal straight through to the associated FET of Attenuator 150. However, at the end of the time period when the DAC has completed any sequence of intermediate level changes to attain some final desired level or has otherwise finished "ramping," Deglitch Circuits 161 and 162 latch and supply a final output voltage level to the FETs so that any level changes that might otherwise be generated by the DAC circuitry is not passed on to FETs 131 and 141. For example, Deglitch Circuits 161 and 162 may be configured to drive the gates of FETs 131 and 141 into saturation upon termination of the selected transition time period or attainment of some final voltage level thereby avoiding changes in attenuation and amplifier output level that might otherwise be caused by variations in circuit operation.

According to the embodiment of FIG. 2, a common low voltage output from the attenuator circuitry at the output of Amplifier 110 is supplied as an (inverting or "−") input to Amplifier 210. An output of Amplifier 210 drives each of three Current Sources 251, 252 and 253. One of the current sources, 253 drives FET 221 with an output therefrom being supplied back to an opposite (non-inverting or "+") input of Amplifier 210. FET 221 thereby operates as a voltage reference with which the output of Amplifier 110 is compared and regulated. Thus, in response to a differential between the output from Amplifier 110 and the voltage reference supplied by FET 221, Amplifier 210 operates Current Sources 251-253 so as to maintain the voltage across that reference the same as the common mode voltage. This is basically the off state of the FETs.

Incrementing of signal supplied to FETs 131 and 141 or "ramping" is performed by FETs 211, 212 and 213 in combination with Switches 241, 242 and 243. According to a preferred embodiment of the invention, FETs 211, 212, 213 and 221 are scaled versions of FETs 131 and 141 of Attenuator 150. Thus, as switch elements in the form of FETs 241, 242 and 243 operate to open (not conduct) and close (conduct), each changes a voltage level appearing at a node connected to and used to drive FETs 131 and 141. The common low voltage is used as a reference by DAC 120, i.e., "tells" the DAC where the bottom reference voltage is. The top reference voltage is VCC so that DAC 120 is configured to provide an output voltage level that incrementally transitions between the common mode voltage and VCC. Up/Down Counter 130 selectively increments or decrements a count value so as to selectively operate (i.e., "open" and "close") FETs 241, 242 and 243. In, response to FETs 241-243 being made to selectively conduct the voltage level at the corresponding nodes driving Deglitch Circuits 161 and 162 changes so to appropriately drive FETs 131 and 141. The sequence, order and combination of control signals provided to FETs 131 and 141 is dependent on whether Up/Down Counter 130 is incrementing (e.g., "ramping up") or decrementing (e.g., "ramping down") and may further be controlled by additional logic and/or control circuitry, not shown.

According to a preferred embodiment, FETs 131 and 141 of Attenuator 150 are selected to correspond to the corresponding series resistors. For example, FETs 131 and 141 may be selected to have a channel resistance of approximately 20% of the resistance value of a corresponding one of series resistors 112 and 121. Preferably the resistor ratio is approximately equal for the series and shunt legs of attenuator 150.

Further, the output signal level provided by the DAC to the FETs of Attenuator 150 may support a transfer function defining a voltage to be applied to the FET in response to a particular count value. In FIG. 1 the transfer function is a result of the use of current sources to provide an appropriate control signal to the FETs. Because of this, DAC 120 implements a dB linear (e.g., logarithmic) change in values due to the configuration of the FETs and resistors forming the voltage divider attenuator circuit and/or the transfer function thereby implemented. Alternatively or in addition, a programmed digital value may be output by Counter 130 to the DAC instead of a straight count so that the "count" value corresponds directly to a desired series of voltage values rather than to merely an incremental count value.

In the present embodiment, for ease of illustration of the basic operating principles of such an embodiment, only one set of series and parallel switching element in the form of FETs 131 and 141 are shown for providing a digital attenuation function and relatively coarse AGC. However, any number and configuration of switching elements to adjust a level or other operating characteristic of a circuit may be used. For example, as will be discussed with reference to FIG. 3, any number of switching elements may be used in series and/or parallel depending upon design requirements and the type and number of signal level (or other) increments to be implemented. In the present example of FIG. 2, selectable coarse gain steps are provided by the elements of Attenuator 150 in the form of FETs 131 and 141. However, the transition between these programmable steps are automatically implemented as a series of fine intermediate level steps using switching elements 241, 242 and 243, such as may comprise FETs configured to provide switchable control. Note that while coarse step adjustments are digitally controlled by an external or, in this case, internal control signal (e.g., implementing an AGC functionality), the fine, intermediate steps are automatically implemented so as to provide a smooth or stepwise transition between commanded coarsely regulated level steps. Both the increment (or spacing between levels) and number of levels for either or both the coarse and fine level adjustments may be varied, the former to provide appropriate level control, the latter to minimize level jumps and discontinuities while transitioning between selected levels.

For example, Up/Down Counter 130 may provide any number of bits for selecting an appropriate number of steps and/or function for transitioning between selected levels. A counter providing a three-bit output, one bit to each of three switching elements, can thereby specify up to eight intermediate levels ($2^3=8$) as in the present example. A four bit counter may support sixteen intermediate levels (or two end levels and fourteen intermediate levels for a total of sixteen), and so on. Note that the output from these switching elements may be summed to provide suitable control signals to subsequent switching elements (e.g., FET 141 through Deglitch Circuit 162) that provide coarse level control but are operated in a linear region to provide a smoother transition between such limited number of selectable levels.

Figure 3:
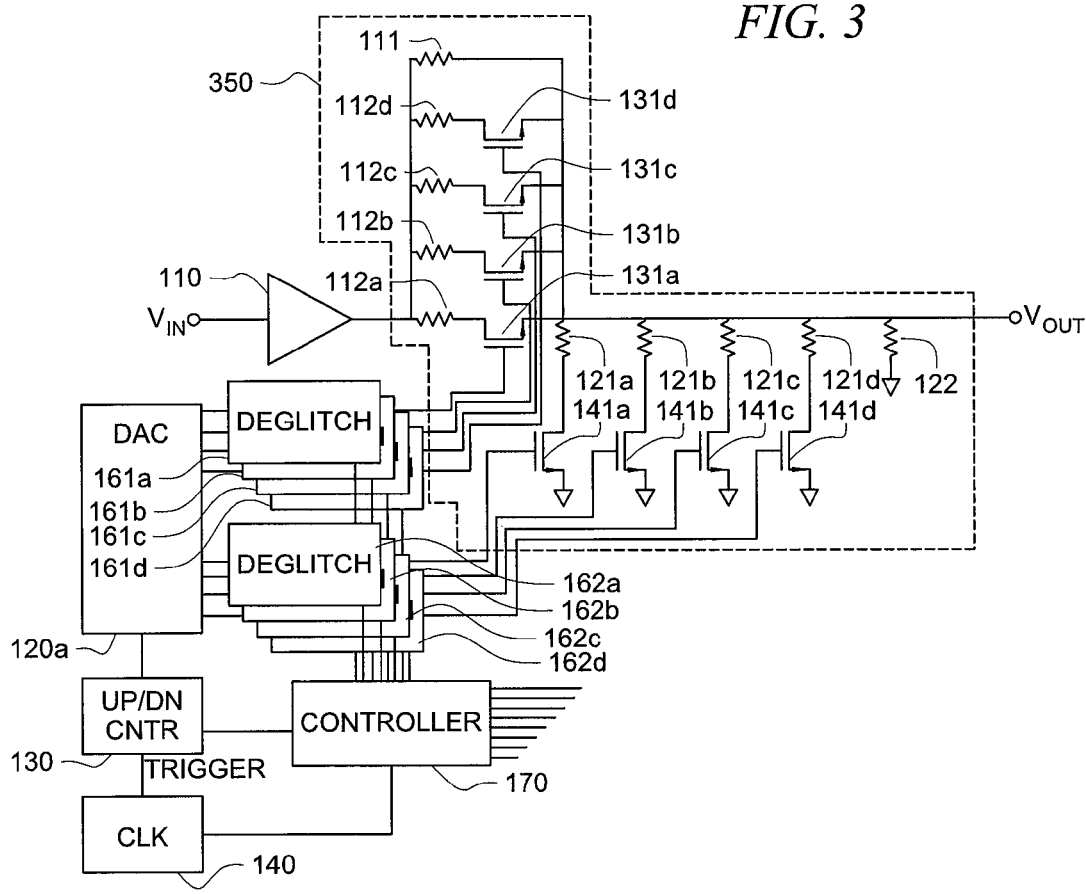
FIG. 3 is a circuit diagram of a variable attenuator circuit providing AGC functionality over a plurality of digitally controlled signal level steps.

To further enhance circuit operation, control signals for FETs 131 and 141 may be supplied through respective Deglitch Circuits 161 and 162. The Deglitch Circuits not only latch a final control signal level to be supplied to the associated FET, but coordinate control signals between multiple FETs so that only one is permitted to be transitioning between on and off states at any one time period. For example, FIG. 3 is a circuit diagram of a variable Attenuator 350 providing AGC functionality over a plurality of digitally controlled signal level steps using a plurality of parallel switch elements (FETs 131a-131d and 141a-141d) forming each of two legs of a voltage divider network. In the present example, FETs 131a, 131b, 131c and 131d are arranged in parallel with each other as are FETs 141a, 141b, 141c and 141d so as to provide coarse output level control of Amplifier 110. However, in this case, coarse output level may include $2^8$ or 256 selectable attenuation and thereby output levels. As in the previous embodiment, rather than merely switching each of these FETs between on and off states, DAC 120 in combination with Deglitch Circuits 161a-161d and 162a-162d automatically moderates the switching by providing a sequence of monotonically stepwise increasing or decreasing control signals to the gates of FETs 131a-131d and 141a-141d to provide a smoother transition between output levels and avoid discontinuities. As previously mentioned, the channel resistance of the FETs of Attenuator 350 should match that of the corresponding series resistors.

Deglitch Circuits 161a-161d and 162a-162d selectively transmit control signals from the associated DAC 120a, 120b to the gate of an associated FET of Attenuator 350 under control of Controller 170 so that only one FET of Attenuator 350 changes conductance values (i.e., is transitioned between on and off states) during any time (signal transition) period. Further, each Deglitch Circuit may be matched to a particular FET to provide an appropriate switching transition profile. Alternatively, each FET may be provided with a dedicated DAC.

Figure 4:
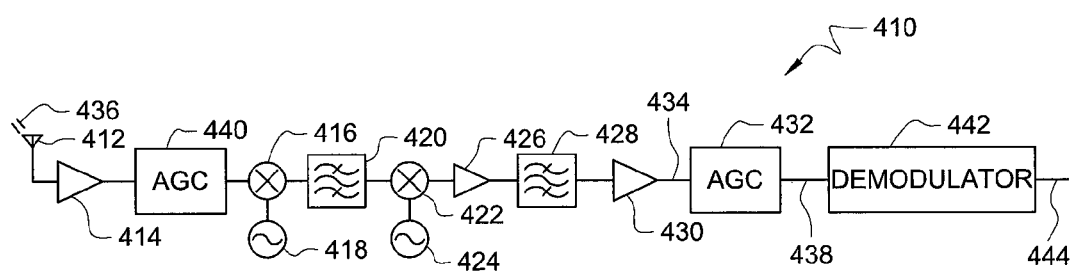
FIG. 4 is a block diagram of a television tuner incorporating AGC functionality and circuitry according to an embodiment of the present invention.

FIG. 4 is a block diagram of a tuner including level control circuitry according to an embodiment of the invention. Although the present illustration incorporate level control according to an embodiment of the present invention into a specific tuner, embodiments of the present invention may be used equally in other tuner configurations and environments. Prior art television tuners are described, for example, in U.S. patent application Ser. No. 11/023,691 filed Dec. 28, 2004 and Ser. No. 11/325,854 filed Jan. 5, 2006, the disclosures of which are incorporated herein by reference in their entireties.

Referring to FIG. 4, a television receiver may include a Tuner 410 having an input device 412 coupled to an RF Amplifier Circuit 414 for supplying a radio frequency (RF) signal such as, but not limited to, an off-the-air or cable television signal. Although FIG. 4 is illustrated and detailed with respect to a particular dual conversion tuner architecture for Tuner 410, it should be understood that any suitable direct dual single, dual conversion (or greater) tuner architecture may be used without departing from the scope of this disclosure. Therefore, while a particular example of Tuner 410 is illustrated and described herein, other architectures for Tuner 410 are applicable. Referring to FIG. 4, an RF output of RF Amplifier Circuit 414 is connected to First AGC Circuit 440 for controlling a level of the RF signal. First AGC Circuit 440 may be implemented as detailed above in connection with FIG. 3 of the drawings or otherwise consistent with the various embodiments of the present invention. For example, although the circuit may be implemented as an attenuator, implementations including a controllable gain amplifier circuit may be provided. Thus, in the present example, First Amplifier Circuit 414 and First AGC Circuit 440 may be combined such that an amount of amplification of First Amplifier Circuit 414 is controlled by the AGC functionality of First AGC Circuit 440 instead of or in addition to providing some form of passive signal attenuation.

First Mixer 416 is coupled to First AGC Circuit 440 and a First Local Oscillator 418. A First Filter 420 is coupled to First Mixer 416 and a Second Mixer 422, which is further coupled to a Second Local Oscillator 424. An First IF Amplifier 426, such as a low noise amplifier (LNA), couples Second Mixer 422 to a Second Filter 428. Tuner 410 may further comprise a Second IF Amplifier Circuit 430 coupled to Second Filter 428 which supplies a filtered IF signal to Second IF Amplifier 430. The filtered and amplified IF signal 434 from Second IF Amplifier 430 is transmitted to Second AGC Circuit 432 which may be implemented as described in connection with First AGC Circuit 440 or otherwise. It should be further noted that, although two AGC Circuits are shown in the present illustration, any number, configuration and/or placement of such circuits may be used.

The IF signal 438 from Second AGC Circuit 432 is coupled to Demodulator 442 for providing one or more baseband output signal, e.g., video and/or audio signals derived from information modulated on the RF and IF signals.

Input Device 412 may comprise a terrestrial antenna, a cable input, a satellite dish, or any other suitable device for receiving a broadband signal 436 from a variety of sources. Signal 436 may comprise video and audio data carried on analog or digital signals, such as RF signals over a frequency range. In this regard, signal 436 comprises a modulated signal. In one embodiment, signal 436 may comprise signals in the television band.

First Mixer 416 may be any suitable device that multiplies an RF signal received from RF Amplifier Circuit 414 with a local oscillator (LO) signal received from a First Local Oscillator 418 to generate an IF signal. Local Oscillator 418 may comprise any suitable device that generates a local oscillator signal at a selected frequency. In one embodiment, the local oscillator frequency associated with Local Oscillator 418 is selected so that Mixer 416 performs an up-conversion of the RF signal received from RF Amplifier Circuit 414.

Filter 420 may comprise any suitable number and combination of frequency selective components that may be used in Tuner 410. In one embodiment, Filter 420 comprises a band-pass filter that provides coarse channel selection of signals 436 in Tuner 410. As a matter of design choice, Filter 420 may be constructed on the same integrated circuit substrate as Mixers 416 and 422, or Filter 420 may be a discrete off-chip device. Filter 420 selects a band of channels or even a single channel from the signals 436 in the IF signal received from Mixer 416.

Following Filter 420, Mixer 422 mixes the first IF signal with a second local oscillator signal from Local Oscillator 424 to generate a second IF signal. In one embodiment, Mixer 422 performs a down conversion of the IF signal to a particular frequency. The second IF signal then passes through Filter 428 which limits the bandwidth of the signal to a single channel by attenuating unwanted adjacent channels. In one embodiment, Filter 428 comprises a surface acoustic wave (SAW) filter. The output of Filter 428 is input to Second Amplifier Circuit 430 which operates in conjunction with Second AGC Circuit 432, First Amplifier Circuit 414 and First AGC Circuit 440 to control the amplitude of input signal 434, and therefore the overall gain of Tuner 410.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A level control circuit comprising:
   a detector configured to detect a change in level value defined by a digital level control signal; and
   a moderator configured to monotonically change a level of an input signal over some predefined transition period in response to said digital level control signal so as to achieve a desired output signal level by:
   determining a desired configuration of switching element states to effectuate said desired signal level, and selectively supplying a sequence of monotonically changing control voltages to ones of said switching elements to transition between an initial configuration and said desired configuration; and a deglitch circuit connected to said moderator and to said switching elements, said deglitch circuit configured to coordinate control signals between said moderator and said switching elements such that a minimum number of transitions are permitted to occur at one time.

2. The circuit according to claim 1 wherein said moderator is further configured to incrementally change a conduction state of a switching element during a transition between fully on and off states of said switching element.

3. The circuit according to claim 1 wherein said moderator comprises:

a counter configured to provide a changing digital count value;

a digital-to-analog converter configured to convert said digital count value into an analog signal level; and an output circuit configured to supply said analog signal level to a switching element during said transition period.

4. The circuit according to claim 3 further comprising:

a latch configured to output a level of said analog signal supplied to said switching element upon termination of said transition period.

5. The circuit according to claim 1 further comprising:

a deglitch circuit configured to monitor a level of an analog signal and, in response, provide said digital level control signal for maintaining a level of said analog signal at a desired value.

6. The circuit according to claim 1 wherein said moderator is further configured to supply a incrementally changing control voltage to vary a conduction level of a switching element over a transition period.

7. A method of operating a level control circuit comprising the steps of:

detecting a change in level value defined by a digital level control signal;

monotonically changing a level of an input signal over some predefined transition period in response to said digital signal so as to achieve a desired output signal level;

determining a desired configuration of switching element states to effectuate said desired signal level, and selectively supplying a sequence of monotonically changing control voltages to ones of said switching elements to transition between an initial configuration and said desired configuration; and coordinating, using a deglitch circuit connected to said moderator and to said switching elements, control signals between said moderator and said switching elements such that a minimum number of transitions are permitted to occur at one time.

8. The method according to claim 7 wherein said step of monotonically changing said level of said input signal includes incrementally changing a conduction state of a switching element during a transition between fully on and off states of said switching element.

9. The method according to claim 7 wherein said step of monotonically changing said level of said input signal includes steps of:

counting to provide a changing digital count value;

converting said digital count value into an analog signal level; and supplying said analog signal level to a switching element during said transition period.

10. The method according to claim 9 further comprising the step of latching an output level of said analog signal supplied to said switching element upon termination of said transition period.

11. The method according to claim 7 further comprising a step of:

monitoring a level of an analog signal and, in response, providing said digital level control signal for maintaining a level of said analog signal at a desired value.

12. The method according to claim 7 wherein said step of monotonically changing a level of said input signal includes a step of supplying a incrementally changing a control voltage to vary a conduction level of a switching element over a transition period.

* * * * *